United States Patent [19]
Holt

[11] Patent Number: 5,914,854
[45] Date of Patent: Jun. 22, 1999

[54] LOCKING PERSONAL COMPUTER EXPANSION CARD GUIDE

[75] Inventor: George T. Holt, Austin, Tex.

[73] Assignee: Dell USA, L.P., Round Rock, Tex.

[21] Appl. No.: 08/775,635

[22] Filed: Dec. 31, 1996

[51] Int. Cl.⁶ .................. G06F 1/16; H05K 7/12
[52] U.S. Cl. .................. 361/683; 361/754; 361/798; 439/152
[58] Field of Search .................. 361/683, 732, 361/740, 754, 759, 798, 801; 439/152, 153, 157, 377

[56] References Cited

U.S. PATENT DOCUMENTS

| | | | |
|---|---|---|---|
| 4,080,031 | 3/1978 | Sawford-Atkins | 439/377 |
| 4,740,164 | 4/1988 | Schulz et al. | 439/152 |
| 4,778,401 | 10/1988 | Boudreau et al. | 439/153 |
| 4,947,289 | 8/1990 | Dynie | 439/152 |
| 5,211,568 | 5/1993 | Yamada et al. | 439/153 |
| 5,317,483 | 5/1994 | Swindler | 361/801 |
| 5,387,115 | 2/1995 | Kozel et al. | 439/157 |
| 5,398,156 | 3/1995 | Steffes et al. | 361/683 |
| 5,398,164 | 3/1995 | Goodman et al. | 361/752 |
| 5,594,627 | 1/1997 | Le | 361/801 |
| 5,601,349 | 2/1997 | Holt | 312/265.6 |

*Primary Examiner*—Lynn D. Feild
*Attorney, Agent, or Firm*—Skjerven, Morrill, MacPherson, Franklin & Friel, L.L.P.; Stephen A. Terrile; Michael P. Noonan

[57] ABSTRACT

An apparatus for restricting a card within a card cage. The apparatus includes a clamping mechanism for frictionally restricting the facing sides of the card so as to restrict the card within the card cage and an actuating mechanism coupled to the clamping mechanism for actuating the clamping mechanism.

19 Claims, 5 Drawing Sheets

LOCKING PERSONAL COMPUTER EXPANSION CARD GUIDE

BACKGROUND OF THE INVENTION

1. Field of the Invention

The present invention relates generally to computer systems, and more particularly to apparatus for coupling expansion cards within a computer system.

2. Description of the Related Art

Computer systems in general and International Business Machines (IBM) compatible personal computer systems in particular have attained widespread use for providing computer power to many segments of modern society. A personal computer system can usually be defined to include a system unit having a system processor and associated volatile and non-volatile memory which are contained within a desk top, floor standing, or portable housing. A personal computer system can also include a display monitor, a keyboard, one or more diskette drives, a fixed disk storage device and an optional printer. One of the distinguishing characteristics of these systems is the use of a system board to electrically connect these components together. These personal computer systems are information handling systems which are designed primarily to give independent computing power to a single user (or a relatively small group of users in the case of personal computers that serve as computer server systems) and are inexpensively priced for purchase by individuals or small businesses.

A personal computer system may also include one or a plurality of input/output (I/O) devices (i.e., peripheral devices) which are coupled to the system processor and which perform specialized functions. Examples of I/O devices include modems, sound and video devices or specialized communication devices. Mass storage devices such as hard disks, CD-ROM drives and magneto-optical drives are also considered to be peripheral I/O devices. It is known to provide certain I/O devices as expansion cards. Computer systems are customarily provided with metal card cage structures within the housings of the computer systems. The card cage structures are adapted to receive and removably support a plurality of expansion cards.

When operatively installed in the computer system, an expansion card upgrades or expands the operating capabilities of the computer. Expansion cards may be installed in the computer during its original manufacture or may be subsequently installed by the user. Typical types of expansion cards include network, sound, graphics accelerator and multimedia cards.

An expansion card is a relatively small, generally rectangularly shaped printed circuit board having a connector edge portion along one side edge. The connector edge portion operatively couples with a corresponding socket portion of the system board via a card slot to operatively couple the installed card to the motherboard. The card slots of the cage structure are relatively oriented in a manner such that the expansion cards installed therein are arranged in a spaced apart, parallel, facing series with end edges of the cards being aligned with one another.

Extending along these aligned end edge portions of the expansion cards are sheet metal connecting brackets having outwardly bent securement tab portions positioned adjacent the side edge portions of the cards opposite their connector edge portions. These tab portions rest upon an in-turned side wall ledge of the cage structure and have notches formed therein that overlie and register with a spaced series of threaded circular openings in the ledge. Each bracket tab is removably secured to the ledge by a screw that extends through the tab notch and is threaded into its associated ledge opening. This individual securement of the bracket tabs to the cage structure ledge serves to anchor one end of the installed expansion cards in place within the cage structure.

The expansion cards added into a personal computer by a manufacturer or an individual are often subjected to substantial shock and vibration during computer assembly and when the computer is transported. This shock and vibration can result in the expansion cards becoming dislodged from their interface connector on the systems motherboard. This is especially true because, as mentioned above, the card is typically held in place by a single screw at one end of the expansion card. The other end of the card is often unrestrained in the axis perpendicular to the motherboard and in all other axes.

From the foregoing it can be readily seen that it is desirable to provide an improved apparatus for removably retaining expansion cards in an associated support cage structure in order to eliminate or at least substantially minimize the above mentioned problems associated with the sole conventional use of individual card bracket tab retaining screws. It is accordingly an object of the present invention to provide such an improved apparatus.

SUMMARY OF THE INVENTION

It has been discovered that movement or vibration of an installed expansion card due to manufacturing or transportation may be prevented or minimized by the installation and use of a locking card guide to clamp the facing sides of the expansion card at the otherwise unrestrained end of the expansion card. Such an apparatus provides the advantage of substantially preventing movement of an installed expansion card in any axis. Additionally, such an apparatus restrains an expansion card that includes cable connectors without interfering with the cable connectors.

In one embodiment of the present invention, an apparatus for restricting a card within a card cage includes a clamping mechanism for frictionally restricting the facing sides of the card so as to restrict the card within the card cage and an actuating mechanism coupled to the clamping mechanism for actuating the clamping mechanism.

In another embodiment, a computer system includes a motherboard, a computer chassis with a card cage, and an apparatus for restricting a card within the card cage. The motherboard includes a microprocessor and a connector coupled to the microprocessor. The apparatus includes a clamping mechanism for frictionally restricting the facing sides of the card so as to restrict the card within the card cage and an actuating mechanism coupled to the clamping mechanism for actuating the clamping mechanism.

In another embodiment, a locking card guide includes a clamp including a first clamp finger, a second clamp finger, and a fulcrum, the first clamp finger and the second clamp finger coupled to the fulcrum, and a clamp actuator coupled to the clamp for actuating the clamp so that the clamp continuously and frictionally restricts the card responsive to an initial force upon the clamp actuator.

In another embodiment, a computer system includes a motherboard, a computer chassis, and a locking card guide. The motherboard includes a microprocessor and a connector coupled to the microprocessor. The computer chassis includes a card cage having a card slot to couple a card with the motherboard. The locking card guide includes a clamp including a first clamp finger, a second clamp finger, and a fulcrum, the first clamp finger and the second clamp finger coupled to the fulcrum, and a clamp actuator coupled to the clamp for actuating the clamp so that the clamp continuously and frictionally restricts the card responsive to an initial force upon the clamp actuator.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The following sets forth a detailed description of the preferred embodiments. The description is intended to be illustrative of the invention and should not be taken to be limiting. Many variations, modifications, additions, and improvements may fall within the scope of the invention as defined in the claims that follow.

Figure 1A:
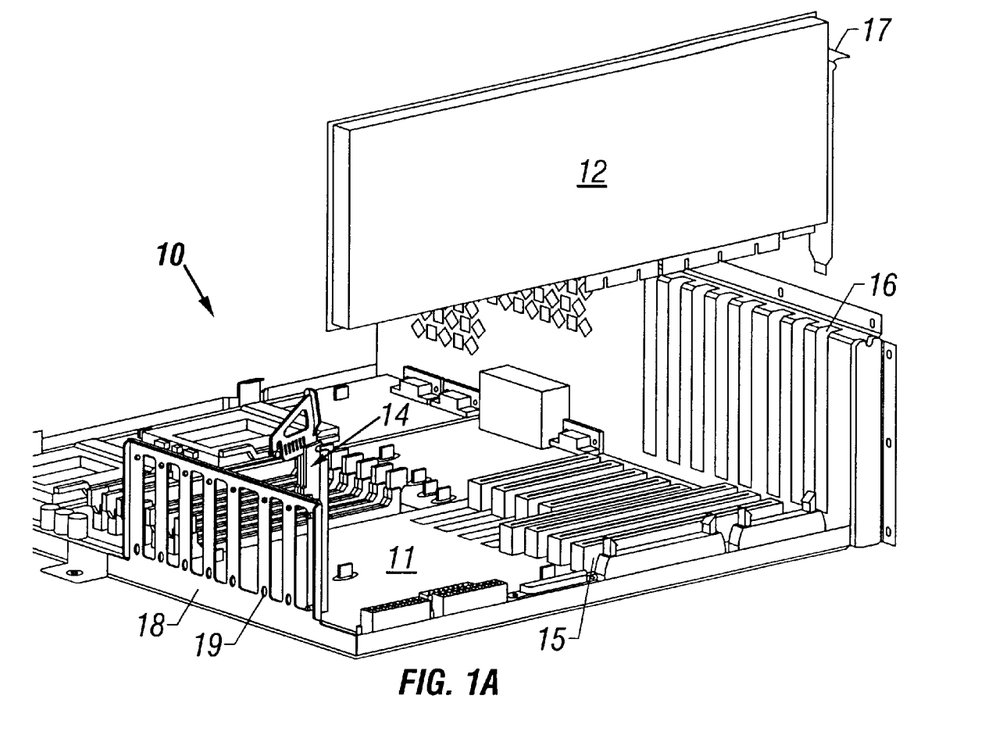
FIGS. 1A–1C, collectively referred to as FIG. 1, present perspective views of a partially disassembled computer system according to the present invention.
Figure 1B:
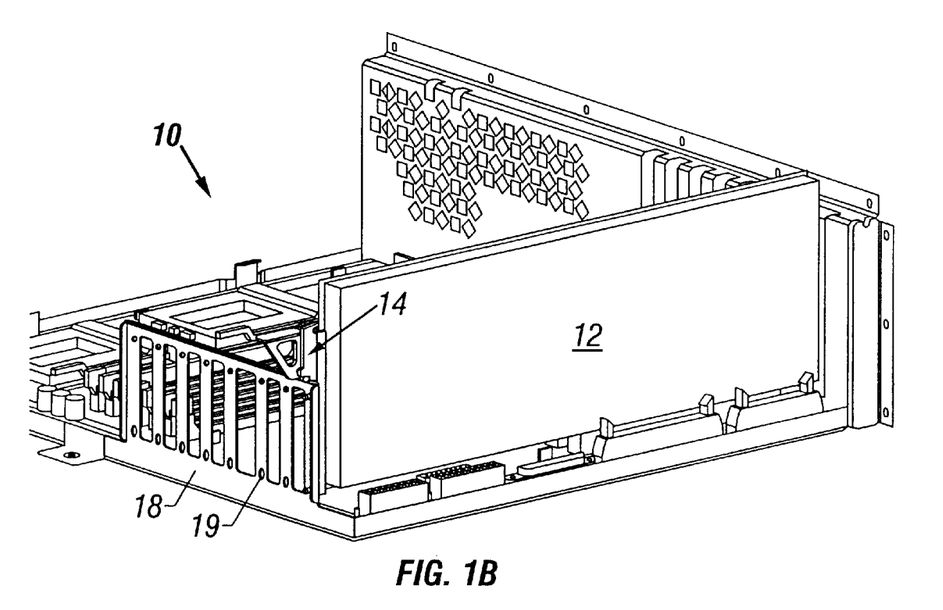
Figure 1C:
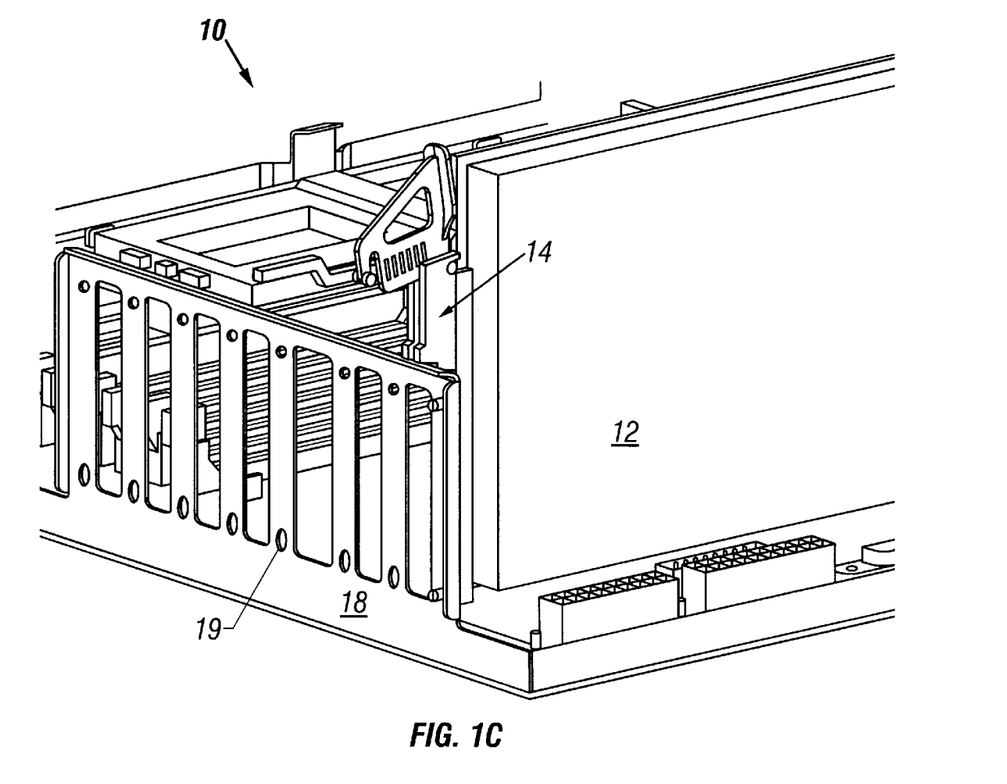

Referring to FIG. 1A, an exemplary computer system 10 is shown. An exemplary desktop computer system is shown, but other types of computer systems, such as tower models, may be used in accordance with the present invention. Computer system 10 is capable of receiving expansion card 12 into card slot 13 which is defined by aperture 16, connector 15 and locking card guide 14. Locking card guide 14 is installed in computer system 10 by attaching the locking card guide 14 to the card cage chassis 18 of computer system 10. The locking card guide 14 may be attached to card cage chassis 18 by one of several means, the preferred of which means is described below. Expansion card 12 is lowered into card slot 13 to electrically couple expansion card 12 to computer system 10 via connector 15. Specifically, expansion card 12 is electrically coupled to motherboard 11. Motherboard 11 either directly or indirectly couples expansion card 12 to a microprocessor. Tab 17 is adapted to receive a screw to attach expansion card 12 to card cage chassis 18. In FIG. 1A, locking card guide 14 is in an unlocked position and is ready to receive expansion card 12. FIGS. 1B and 1C show computer system 10 with an installed expansion card 12. FIG. 1B shows a locked expansion card 12 ready for use with computer system 10, and FIG. 1C shows an unlocked expansion card 12 ready for removal from computer system 10.

Figure 2A:
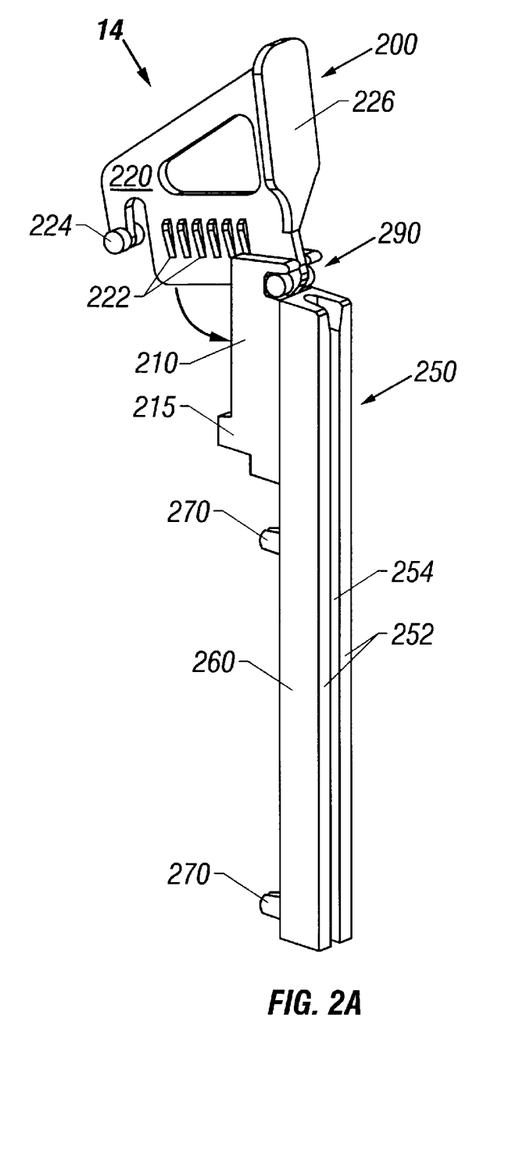
FIGS. 2A and 2B, collectively referred to as FIG. 2, present perspective views of one embodiment of a locking card guide according to the present invention.
Figure 2B:
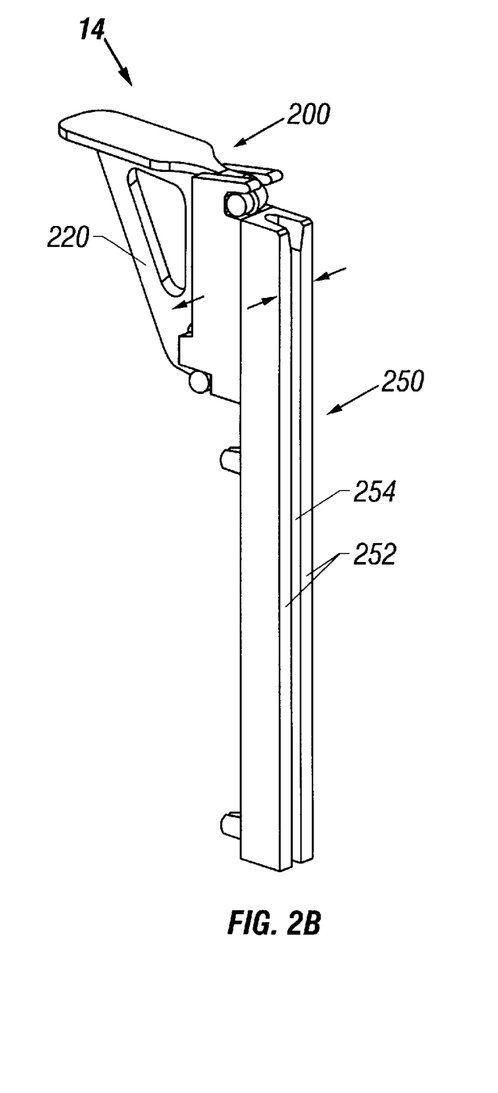
Figure 3A:
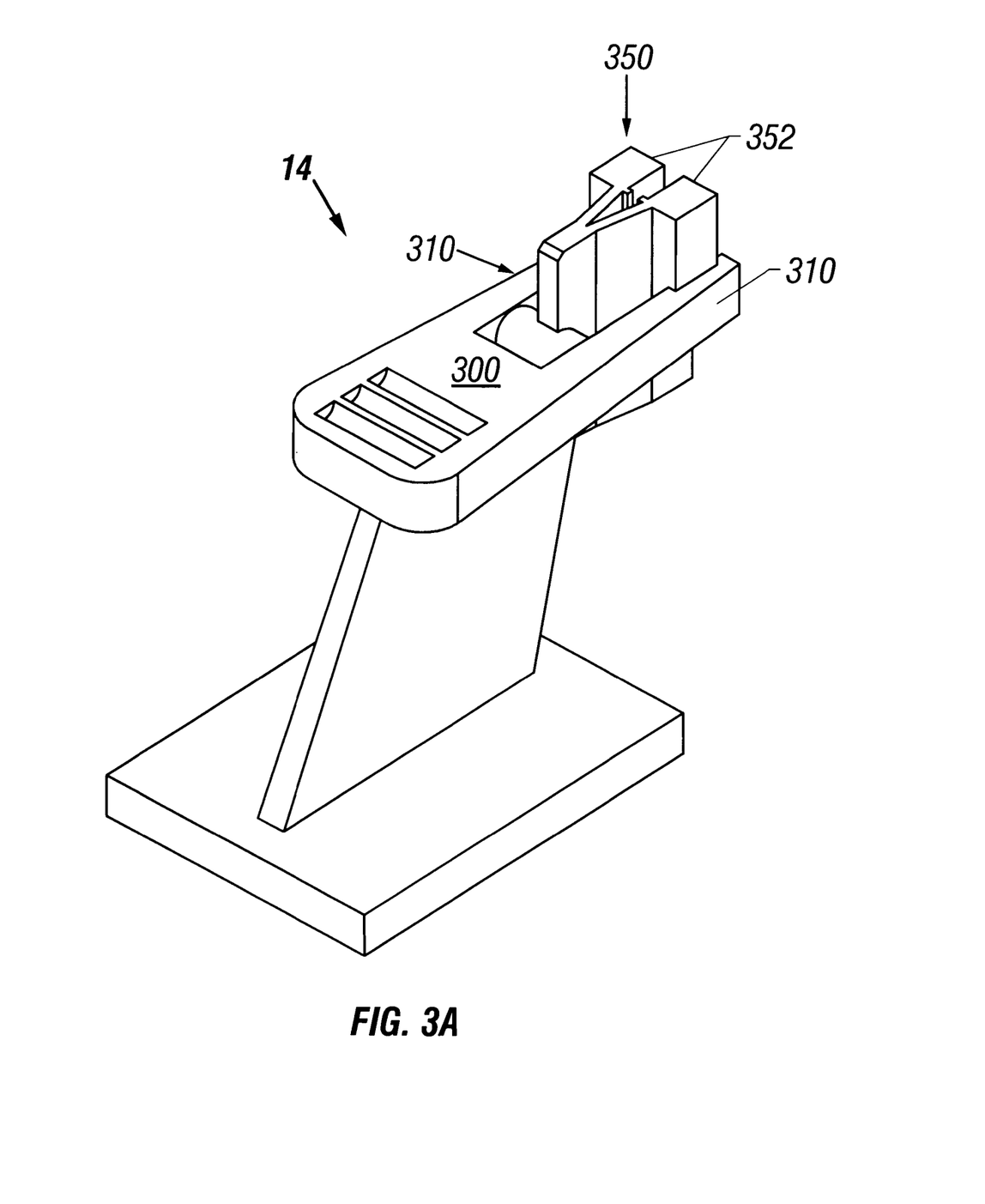
FIGS. 3A–3C, collectively referred to as FIG. 3, present perspective views of another embodiment of a locking card guide according to the present invention.
Figure 3B:
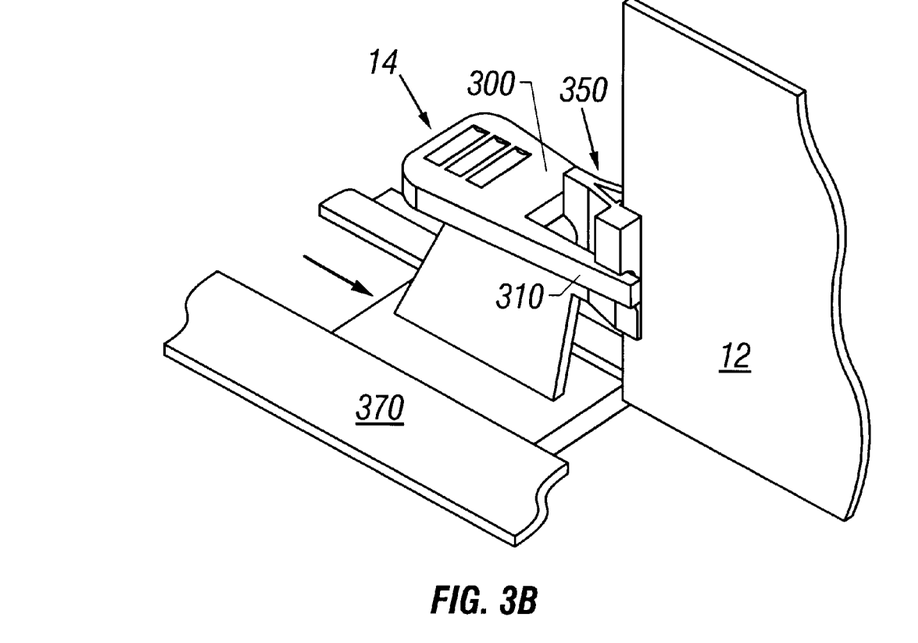
Figure 3C:
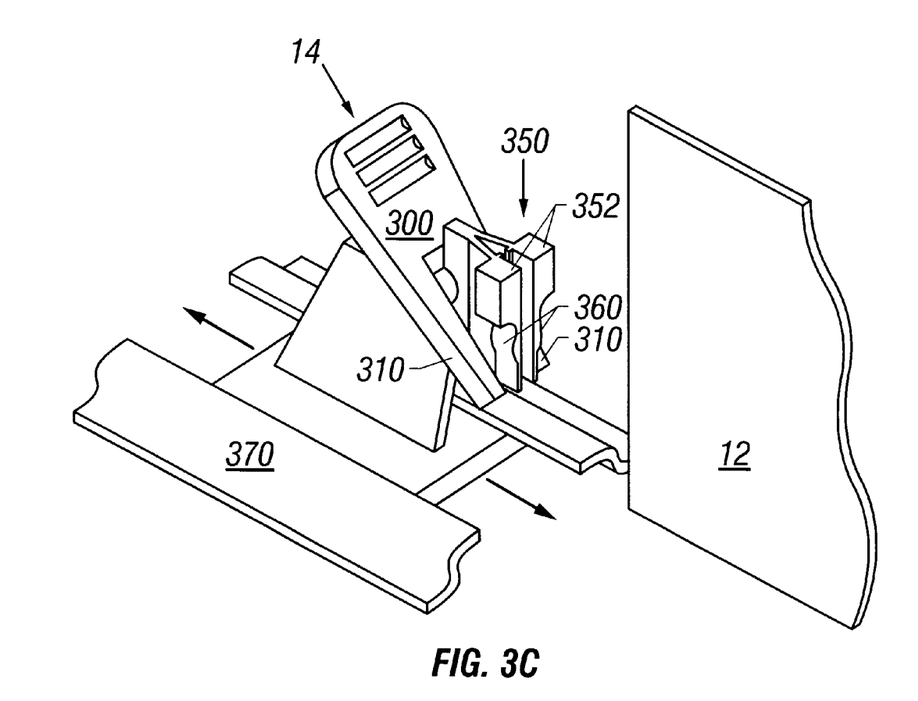

Referring to FIGS. 2 and 3, a locking card guide 14 for restraining or otherwise holding in place an expansion card in a computer system is shown. Locking card guide 14 restrains an expansion card by clamping the facing sides of the card. Referring to FIG. 2, one embodiment of locking card guide 14 includes clamping mechanism 250 coupled to actuating mechanism 200. Referring to FIG. 3, another embodiment of locking card guide 14 includes clamping mechanism 350 coupled to actuating mechanism 300. An initial force applied to actuating mechanisms 200, 300 results in a sustaining clamping force upon an expansion card 12 by clamping mechanisms 250, 350. Thus, expansion card 12 is substantially and continuously restricted from moving when installed in computer system 10. Locking card guide 14 is shown in an unlocked position in FIGS. 2A and 3C. Locking card guide 14 is shown in a locked position in FIGS. 2B and 3B.

Referring to FIG. 2, clamping mechanism 250 holds an expansion card when actuated by actuating mechanism 200. More specifically, clamping portion 250 includes two elongated clamping protrusions 252 which provide clamping fingers and extend along the length of the base 260 of locking card guide 14. Clamping protrusions 252 define groove 254 for guiding expansion card 12 into proper position in computer system 10. The groove receives an edge of expansion card 12 so that the clamping protrusions 252 can clamp onto the sides of expansion card 12.

In the preferred embodiment, clamping protrusions 252 are generally joined at an end opposite from the end receiving expansion card 12. Consequently, clamping protrusions 252 are generally U-shaped. The crotch of the "U" receives the edge of expansion card 12, and the legs of the "U" frictionally restrict the facing sides of expansion card 12. "Generally U-shaped" is defined to include generally V-shaped.

Actuating mechanism 200 includes two vertical, substantially flat protrusions 210 extending from the rear of base 260 of locking card guide 14. These flat protrusions 210 form a lock actuator receiver and are adapted to receive a lock actuator 220. When lock actuator 220 is forced into the lock actuator receiver (i.e., between flat protrusions 210), the protrusions 210 are displaced outwardly, thereby forcing the clamping protrusions 252 to displace inwardly. The inward displacement of clamping protrusions 252 causes the width of groove 254 to lessen in magnitude. (See motion arrows, FIG. 2B.) In this way, clamping protrusions 252 clamp onto expansion card 12 when the edge of expansion card 12 is placed within groove 254. Thus, expansion card 12 is frictionally and substantially restricted from moving while locked by locking card guide 14.

In the preferred embodiment, flat protrusions 210 and clamping protrusions 252 are solidly but flexibly connected. Other connection means, such as a hinge means or other lever means, may be used in accordance with the invention. Further, the lock actuator receiver may take other forms than that of flat protrusions 210, so long as a force applied to the lock actuator receiver results in a force being applied to clamping protrusions 252. Also, in the preferred embodiment, flat protrusions 210 are generally joined at an end opposite from the end receiving lock actuator 220. Consequently, flat protrusions 210 are generally U-shaped. The crotch of the "U" receives lock actuator 220. "Generally U-shaped" is defined to include generally V-shaped. Together, clamping protrusions 252 and flat protrusions 210 can be placed to form a generally H-shaped or X-shaped cross-section.

Lock actuator 220 is connected to the locking card guide base 260 by a hinge mechanism 290. The lock actuator 220 is forced into the lock actuator receiver by rotating the lock actuator 220 downward about hinge mechanism 290 so that prominences 222 force flat protrusions 210 apart. (See motion arrow, FIG. 2A.) Although multiple prominences are used in the preferred embodiment, it is appreciated that use of a single prominence or of a single wedging surface without a prominence is also in accordance with the invention. Also, although hinge mechanism 290 is used to movably connect lock actuator 220 to the locking card guide base 260, other mechanisms may be used to attach the lock actuator 220 to the locking card guide 14 or to card cage chassis 18. For example, a sliding mechanism or a hanging mechanism may be used in accordance with the invention as long as lock actuator 220 is capable of coupling with the lock actuator receiver to effect a clamping action upon expansion card 12.

A tab 226 is used as a means to facilitate the manual turning of lock actuator 220. A stopper 224 stops the motion of lock actuator 220. The lock actuator 220 is held in the locked position (see FIG. 2B) by stopper 224 latching into position over corner 215. Corner 215 provides a detent to keep lock actuator in the locked position. In this way, an initial force applied to actuating mechanism 200 results in a sustaining clamping force upon expansion card 12 by clamping mechanism 250. Thus, expansion card 12 is substantially and continuously restricted from moving when installed in computer system 10. It is appreciated that other means of holding the lock actuator 220 in the locked position, such as friction between prominences 222 and flat protrusions 210, are contemplated by the present invention. Also, the use of means for automatically turning lock actuator 220 is in accordance with the present invention.

Chassis attachments 270 extend from the rear of base 260 of locking card guide 14 for attaching locking card guide 14 to card cage chassis 18 of computer system 10. Locking card guide 14 is installed into card cage chassis 18 by inserting chassis attachments 270 into a round chassis aperture 19 in card cage chassis 18 (see FIG. 1). In the preferred embodiment, chassis attachments 270 roughly form a cylinder split down the axis to form a gap between two half cylinders. The gap provides flexibility to chassis attachments 270. Chassis attachments 270 are tapered towards the ends of the split-cylinders. The tapered and flexible nature of this embodiment of chassis attachments 270 allows a snap-like fit when chassis attachments 270 are inserted into a properly sized round chassis aperture 19. Other types of chassis attachment systems may be used to attach locking card guide 14 to computer system 10. Additionally, different materials may be used in accordance with the invention, including plastics and metals. When the locking card guide 14 is attached to card cage chassis 18, computer system 10 is capable of receiving and locking expansion card 12.

Referring again to FIG. 1B, expansion card 12 is installed into card slot 13 in computer system 10. The edge of expansion card 12 facing towards locking card guide 14 is fitted into clamping protrusions 252 of locking card guide 14. Locking card guide 14 is in a locked position. While locking card guide 14 is in a locked position, expansion card 12 is substantially restrained from moving in any direction. Thus, the electrical coupling is preserved between expansion card 12 and connector 15 of computer system 10. Referring to FIG. 1C, locking card guide 14 is in an unlocked position which allows removal of expansion card 12.

An alternative embodiment of the present invention is shown in FIG. 3. Specifically, referring to FIGS. 3B and 3C, locking card guide 14 is movable along an axis parallel to installed expansion card 12 and to the floor of card cage chassis 18. This allows locking card guide 14 to restrain and lock cards of all lengths. A fastening feature 370 provides a track on which locking card guide 14 is movable. When expansion card 12 is installed into card slot 13, locking card guide 14 may be moved to engage the edge of expansion card 12. Actuating mechanism 300 may then be moved to a locked position to force the clamping mechanism 350 to clamp the facing sides of expansion card 12.

In the preferred embodiment, clamping mechanism 350 includes clamping fingers 352 that are flexible and spaced apart to receive a card. Actuating mechanism 300 includes substantially inflexible actuating fingers 310 spaced apart less than clamping fingers 352. Referring to FIG. 3B, when actuating mechanism 300 is rotated downward into a locked position, actuating fingers 310 rotate upward to a juxtaposition with clamping fingers 352. In this position, actuating fingers 310 apply an inward force to clamping fingers 352, causing clamping fingers 352 to displace inwardly. A ridge 360 prevents actuating fingers 310 from slipping off of clamping fingers 352. The actuating mechanism 300 is held in the locked position by friction between ridge 360 and clamping fingers 310. In this way, an initial force applied to actuating mechanism 300 results in a sustaining clamping force upon expansion card 12 by clamping mechanism 350. Thus, expansion card 12 is substantially and continuously restricted from moving when installed in computer system 10.

Referring to FIG. 3C, an upward force upon actuating mechanism 300 removes actuating fingers 310 from juxtaposition with clamping fingers 352, thereby releasing clamping fingers 352 from the inwardly displacing force. When locking card guide 14 is in the open position, expansion card 12 is ready for removal from computer system 10.

While the invention has been described with reference to various embodiments, it will be understood that these embodiments are illustrative and that the scope of the invention is not limited to them. Many variations, modifications, additions, and improvements of the embodiments described are possible. Those skilled in the art will recognize that alternative embodiments may be implemented in agreement with the present invention. For example, the card face may be clamped by applying an initial force directly to the clamp fingers or by any means of transferring an initial force on any element to a continuous force of the clamping fingers on the expansion card.

Further, although the clamping fingers of the embodiment pictured in FIG. 3 are not of the elongated type, it is appreciated that the clamping fingers of that embodiment may take such a form, as well as other forms. Also, although the clamping fingers of the embodiment pictured in FIG. 2 are of the elongated type, it is appreciated that the clamping fingers of that embodiment may take a different form. Furthermore, the clamping techniques described herein are merely illustrative and a variety of additional and/or alternative techniques may be analogously provided in accordance with the present invention. For example, although the preferred embodiment utilizes unitary, flexible clamps, other clamps may be used, such as hinged clamps. These and other variations, modifications, additions, and improvements may fall within the scope of the invention as defined in the claims which follow.

What is claimed is:

1. An apparatus for restricting a card within a card cage, the card having sides the apparatus comprising:
   a clamping mechanism for frictionally restricting facing sides of the card so as to restrict the card within the card cage; and
   an actuating mechanism coupled to the clamping mechanism for actuating the clamping mechanism, wherein the actuating mechanism includes:
      a clamp actuator receiver cooperatively coupled to the clamping mechanism so that the clamping mechanism frictionally restricts the card responsive to a force upon the clamp actuator receiver; and a clamp actuator movably coupled to one of the clamping mechanism and the clamp actuator receiver, the clamp actuator capable of transferring an initial force applied to the clamp actuator to the clamp actuator receiver, the clamp actuator continuously applying a force to the clamp actuator receiver, thereby causing the clamping mechanism to continuously and substantially restrict the card from moving; and wherein the clamping mechanism includes clamping fingers;

the clamp actuator receiver includes clamp actuator protrusions; and the clamp actuator receiver and the clamping mechanism are cooperatively coupled so that the clamping fingers displace inwardly to frictionally restrict the card responsive to an outward force applied to the clamp actuator protrusions by the clamp actuator.

2. The apparatus of claim 1, wherein the clamping fingers comprise elongated, flexible channel members, the flexible channel members spaced to receive an edge of the card between the flexible channel members.

3. An apparatus for restricting a card within a card cage, the card having sides, the apparatus comprising:

a clamping mechanism for frictionally restricting facing sides of the card so as to restrict the card within the card cage, the clamping mechanism not for interferingly restricting an edge of the card; and an actuating mechanism coupled to the clamping mechanism for actuating the clamping mechanism; and wherein the actuating mechanism is cooperatively coupled to that the clamping mechanism so that the clamping mechanism frictionally restricts the card responsive to a first force upon the actuating mechanism, the clamping mechanism releasing the card responsive to a second force upon the actuating mechanism;

the first force is an inward force, and the clamping mechanism includes clamping fingers, the clamping finders displacing inwardly to frictionally restrict the card responsive to the inward force applied to the clamp actuator;

the clamping fingers are flexible and spaced apart a first distance to receive a card;

the actuating mechanism includes substantially inflexible actuating fingers spaced apart a second distance less than the first distance;

the inward force is applied to the clamping fingers by placing the actuating fingers on outside surfaces of the clamping fingers to inwardly displace the clamping fingers; and the inward force is maintained until the actuating fingers are removed from the outside surfaces of the clamping fingers.

4. An apparatus for restricting a card within a card cage, the card having sides the apparatus comprising:

a clamping mechanism for frictionally restricting facing sides of the card so as to restrict the card within the card cage, the clamping mechanism not for interferingly restricting an edge of the card; and an actuating mechanism coupled to the clamping mechanism for actuating the clamping mechanism; and wherein the apparatus is movable on a track in the card cage along an axis parallel to the card to alternately clamp cards of different lengths in the card cage.

5. A locking card guide comprising:

a clamp including a first clamp finger, a second clamp finger, and a fulcrum, the first clamp finger and the second clamp finger coupled to the fulcrum; and a clamp actuator coupled to the clamp for actuating the clamp so that the clamp continuously and frictionally restricts a card responsive to an initial force upon the clamp actuator; and wherein the first clamp finger includes a clamping end and an actuating end;

the second clamp finger includes a clamping end and an actuating end, the second clamp finger in substantially parallel, spaced relation to the first clamp finger, wherein the clamping end of the first clamp finger is opposite the clamping end of the second clamp finger and the actuating end of the first clamp finger is opposite the actuating end of the second clamp finger; and the fulcrum portion is coupled between the first and second clamp fingers and between the clamping ends and the actuating ends of the first and second clamp fingers, the first and second clamp fingers rotationally flexible around the fulcrum portion; and the clamp actuator is movably coupled to the clamp, the clamp actuator including a surface, the clamp actuator movable between a first position and a second position, the surface of the clamp actuator in the first position outwardly engaging the actuating ends of the first and second clamp fingers so that the clamping ends of the first and second clamp fingers displace inwardly to clamp the card.

6. The locking card guide of claim 5 wherein the clamp is elongated to provide a guide for installation of the card and to increasingly frictionally restrict the card.

7. A locking card guide comprising:

a clamp including a first clamp finger, a second clamp finger, and a fulcrum, the first clamp finger and the second clamp finger coupled to the fulcrum; and a clamp actuator coupled to the clamp for actuating the clamp so that the clamp continuously and frictionally restricts a card responsive to an initial force upon the clamp actuator; and wherein the clamp includes clamp fingers capable of displacing inwardly to frictionally restrict the card responsive to an inward force applied to the clamping fingers by the clamp actuator;

the clamp fingers are flexible and are spaced apart a first distance to receive a card;

the clamp actuator includes substantially inflexible actuating fingers spaced apart a second distance less than the first distance;

the inward force is applied to the clamp fingers by placing the actuating fingers on outside surfaces of the clamp fingers to inwardly displace the clamp fingers; and the inward force is maintained until the actuating fingers are removed from the outside surfaces of the clamping fingers.

8. A locking card guide comprising:

a clamp including a first clamp finger, a second clamp finger, and a fulcrum, the first clamp finger and the second clamp finger coupled to the fulcrum ; and a clamp actuator coupled to the clamp for actuating the clamp so that the clamp continuously and frictionally restricts a card responsive to an initial force upon the clamp actuator; and wherein the clamp includes
  a generally U-shaped channel for clasping a card, the channel having a base portion coupled to first and second channel legs; and
  a generally U-shaped actuator receiver, the actuator receiver having a base portion coupled to first and second actuator receiver legs, the channel and the actuator receiver in positional relation to provide a generally H-shaped cross-section, the channel legs inwardly flexible in response to outward flex of the actuator receiver legs; and
the clamp actuator is hingedly coupled to the clamp; the clamp actuator movable between a first position and a second position; the clamp actuator in the first position applying a splitting force on the legs of the actuator receiver, thereby locking the clamp in a clamping position; the clamp actuator in the second position releasing the splitting force from the actuator receiver.

9. A computer system comprising:
a motherboard including a microprocessor and a connector coupled to the microprocessor;
a computer chassis including an interior surface and an interiorly-positioned card cage associated with the interior surface, the card cage having a card slot therein to couple a card with the motherboard via the connector; and
an apparatus for restricting a card within the card slot of the card cage, the apparatus coupled to the computer chassis, the apparatus including
  a clamping mechanism for frictionally restricting facing sides of the card so as to restrict the card within the computer system; and
  an actuating mechanism coupled to the clamping mechanism for actuating the clamping mechanism; and wherein
the actuating mechanism includes:
  a clamp actuator receiver cooperatively coupled to the clamping mechanism so that the clamping mechanism frictionally restricts the card responsive to a force upon the clamp actuator receiver; and
  a clamp actuator movably coupled to one of the clamping mechanism and the clamp actuator receiver, the clamp actuator capable of transferring an initial force applied to the clamp actuator to the clamp actuator receiver, the clamp actuator continuously applying a force to the clamp actuator receiver, thereby causing the clamping mechanism to continuously and substantially restrict the card from moving;
the clamping mechanism includes clamping fingers;
the clamp actuator receiver includes clamp actuator protrusions; and
the clamp actuator receiver and the clamping mechanism are cooperatively coupled so that the clamping fingers displace inwardly to frictionally restrict the card responsive to an outward force applied to the clamp actuator protrusions by the clamp actuator.

10. The computer system of claim 9 wherein the clamping fingers comprise elongated, flexible channel members, the flexible channel members spaced to receive an edge of the card between the flexible channel members.

11. A computer system comprising:
a motherboard including a microprocessor and a connector coupled to the microprocessor;
a computer chassis including an interior surface and an interiorly-positioned card case associated with the interior surface, the card cage having a card slot therein to couple a card with the motherboard via the connector; and
an apparatus for restricting a card within the card slot of the card cage, the apparatus coupled to the computer chassis, the apparatus including
  a clamping mechanism for frictionally restricting facing sides of the card so as to restrict the card within the computer system; and
  an actuating mechanism coupled to the clamping mechanism for actuating the clamping mechanism; and wherein
the actuating mechanism is cooperatively coupled to the clamping mechanism so that the clamping mechanism frictionally restricts the card responsive to a first force upon the actuating mechanism, the clamping mechanism releasing the card responsive to a second force upon the actuating mechanism;
the first force is an inward force;
the clamping mechanism includes clamping fingers, the clamping fingers displacing inwardly to frictionally restrict the card responsive to the inward force applied to the clamp actuator;
the clamping fingers are flexible and spaced apart a first distance to receive a card;
the actuating mechanism includes substantially inflexible actuating fingers spaced apart a second distance less than the first distance;
the inward force is applied to the clamping fingers by placing the actuating fingers on outside surfaces of the clamping fingers to inwardly displace the clamping fingers; and
the inward force is maintained until the actuating fingers are removed from the outside surfaces of the clamping fingers.

12. A computer system comprising:
a motherboard including a microprocessor and a connector coupled to the microprocessor,
a computer chassis including an interior surface and an interiorly-positioned card cage associated with the interior surface, the card cage having a card slot therein to couple a card with the motherboard via the connector; and
an apparatus for restricting a card within the card slot of the card cage, the apparatus coupled to the computer chassis the apparatus including
  a clamping mechanism for frictionally restricting facing sides of the card so as to restrict the card within the computer system; and
  an actuating mechanism coupled to the clamping mechanism for actuating the clamping mechanism;
wherein the apparatus is movable along an axis parallel to the card to alternately clamp cards of different lengths.

13. A computer system comprising:
a motherboard including a microprocessor and a connector coupled to the microprocessor;
a computer chassis including an interior surface and an interiorly-positioned card cage associated with the interior surface, the card cage having a card slot therein to couple a card with the motherboard via the connector; and
a locking card guide for restricting a card within the card slot of the card cage, the locking card guide coupled to the computer chassis, the locking card guide including a clamp including a first clamp finger, a second clamp finger and a fulcrum, the first clamp finger and the second clamp finger coupled to the fulcrum; and a clamp actuator coupled to the clamp for actuating the clamp so that the clamp continuously and frictionally restricts the card responsive to an initial force upon the clamp actuator; and wherein the first clamp finger includes a clamping end and an actuating end;

the second clamp finger includes a clamping end and an actuating end, the second clamp finger in substantially parallel, spaced relation to the first clamp finger, wherein the clamping end of the first clamp finger is opposite the clamping end of the second clamp finger and the actuating end of the first clamp finger is opposite the actuating end of the second clamp finger; and the fulcrum portion is coupled between the first and second clamp fingers and between the clamping ends and the actuating ends of the first and second clamp fingers, the first and second clamp fingers rotationally flexible around the fulcrum portion; and the clamp actuator is movably coupled to the clamp, the clamp actuator including a surface, the clamp actuator movable between a first position and a second position, the surface of the clamp actuator in the first position outwardly engaging the actuating ends of the first and second clamp fingers so that the clamping ends of the first and second clamp fingers displace inwardly to clamp the card.

14. The computer system of claim 13 wherein the clamp is elongated to provide a guide for installation of the card and to increasingly frictionally restrict the card.

15. A computer system comprising:

a motherboard including a microprocessor and a connector coupled to the microprocessor;

a computer chassis including an interior surface and an interiorly-positioned card cage associated with the interior surface, the card cage having a card slot therein to couple a card with the motherboard via the connector; and a locking card guide for restricting a card within the card slot of the card cage, the locking card guide coupled to the computer chassis, the locking card guide including a clamp including a first clamp fingers, a second clamp finger and a fulcrum, the first clamp finger and the second clamp finger coupled to the fulcrum; and a clamp actuator coupled to the clamp for actuating the clamp so that the clamp continuously and frictionally restricts the card responsive to an initial force upon the clamp actuator; wherein the clamp includes clamp fingers capable of displacing inwardly to frictionally restrict the card responsive to an inward force applied to the clamping fingers by the clamp actuator;

the clamp fingers are flexible and are spaced apart a first distance to receive a card;

the clamp actuator includes substantially inflexible actuating fingers spaced apart a second distance less than the first distance;

the inward force is applied to the clamp fingers by placing the actuating fingers on outside surfaces of the clamp fingers to inwardly displace the clamp fingers; and the inward force is maintained until the actuating fingers are removed from the outside surfaces of the clamping fingers.

16. A computer system comprising:

a motherboard including a microprocessor and a connector coupled to the microprocessor;

a computer chassis including an interior surface and an interiorly-positioned card cage associated with the interior surface, the card cage having a card slot therein to couple a card with the motherboard via the connector; and a locking card guide for restricting a card within the card slot of the card cage, the locking card guide coupled to the computer chassis, the locking card guide including a clamp including a first clamp finger, a second clamp finger and a fulcrum, the first clamp finger and the second clamp finger coupled to the fulcrum; and a clamp actuator coupled to the clamp for actuating the clamp so that the clamp continuously and frictionally restricts the card responsive to an initial force upon the clamp actuator; and wherein the clamp includes a generally U-shaped channel for clasping a card; and a generally U-shaped actuator receiver, the channel and the actuator receiver in positional relation to provide a generally H-shaped cross-section, the channel legs inwardly flexible in response to outward flex of the actuator receiver legs; and the clamp actuator is hingedly coupled to the clamp; the clamp actuator movable between a first position and a second position; the clamp actuator in the first position applying a splitting force on the legs of the actuator receiver, thereby locking the clamp in a clamping position; the clamp actuator in the second position releasing the splitting force from the actuator receiver.

17. A locking card guide comprising:

a clamp including a first clamp finger, a second clamp finger, and a fulcrum, the first clamp finger and the second clamp finger coupled to the fulcrum; and a clamp actuator coupled to the clamp for actuating the clamp so that the clamp continuously and frictionally restricts a card responsive to an initial force upon the clamp actuator;

wherein the locking card guide is movable along an axis parallel to a card on a track in a card cage to alternately clamp cards of different lengths in the card cage.

18. A computer system comprising:

a motherboard including a microprocessor and a connector coupled to the microprocessor;

a computer chassis including an interior surface and an interiorly-positioned card cage associated with the interior surface, the card cage having a card slot therein to couple a card with the motherboard via the connector; and an apparatus for restricting a card within the card slot of the card cage, the apparatus coupled to the computer chassis, the apparatus including a clamping mechanism for frictionally restricting facing sides of the card so as to restrict the card within the computer system; and an actuating mechanism coupled to the clamping mechanism for actuating the clamping mechanism;

wherein the apparatus for restricting the card within the card slot of the card cage is movable along an axis parallel to the card on a track in the card cage to alternately clamp cards of different lengths in the card cage.

19. A computer system comprising:

a motherboard including a microprocessor and a connector coupled to the microprocessor;

a computer chassis including an interior surface and an interiorly-positioned card cage associated with the interior surface, the card cage having a card slot therein to couple a card with the motherboard via the connector; and a locking card guide for restricting a card within the card slot of the card cage, the locking card guide coupled to the computer chassis, the locking card guide including a clamp including a first clamp finger a second clamp finger and a fulcrum, the first clamp finger and the second clamp finger coupled to the fulcrum; and a clamp actuator coupled to the clamp for actuating the clamp so that the clamp continuously and frictionally restricts the card responsive to an initial force upon the clamp actuator;

wherein the locking card guide for restricting the card within the card slot of the card cage is movable along an axis parallel to the card on a track in the card cage to alternately clamp cards of different lengths in the card cage.

* * * * *